(12) United States Patent
Boström (10) Patent No.: US 10,090,813 B2
(45) Date of Patent: Oct. 2, 2018

(54) POWER AMPLIFIER

(71) Applicant: BOLECANO HOLDING AB, Ramlösa (SE)

(72) Inventor: Patrik Boström, Ramlösa (SE)

(73) Assignee: BOLECANO HOLDING AB, Ramlösa (SE)

( * ) Notice: Subject to any disclaimer, the term of this patent is extended or adjusted under 35 U.S.C. 154(b) by 0 days.

(21) Appl. No.: 15/160,000

(22) Filed: May 20, 2016

(65) Prior Publication Data

US 2016/0352293 A1 Dec. 1, 2016

(30) Foreign Application Priority Data

May 26, 2015 (SE) ...................................... 1550677

(51) Int. Cl.
*H03F 99/00* (2009.01)
*H03F 3/217* (2006.01)
(Continued)

(52) U.S. Cl.
CPC ............... *H03F 3/217* (2013.01); *H03F 1/34* (2013.01); *H03F 3/183* (2013.01); *H03F 3/187* (2013.01);
(Continued)

(58) Field of Classification Search
CPC ...... H03F 3/217; H03F 3/183; H03F 3/45475; H03F 1/34; H03F 3/187; H03F 2200/17;
(Continued)

(56) References Cited

U.S. PATENT DOCUMENTS

| 4,041,411 A | 8/1977 | Sturgeon |
| 7,113,038 B2 | 9/2006 | Putzeys |

(Continued)

FOREIGN PATENT DOCUMENTS

WO 03/090343 A2 10/2003

*Primary Examiner* — Vivian Chin
*Assistant Examiner* — Con P Tran
(74) *Attorney, Agent, or Firm* — Capitol City TechLaw (57) ABSTRACT

A power amplifier includes an input amplifier, a comparator, a switching circuit, an output filter and a feedback filter. The input amplifier receives an input signal of the power amplifier at a positive input of the input amplifier and an output signal of the feedback filter at a negative input of the input amplifier. The input amplifier has a capacitive feedback from an output of the input amplifier to the negative input of the input amplifier. The comparator receives the output signal of the input amplifier at a positive input of the comparator and the output signal of the feedback filter at a negative input of the comparator. The comparator provides a control signal based on a comparison between signal levels of the signals at the positive and the negative inputs of the comparator. The switching circuit includes power switches and receives the control signal and controls the power switches that connect an output of the switching circuit to either a positive supply voltage or a negative supply voltage based on the control signal. The output filter receives an output signal provided at the output of the switching circuit and provides a filtered signal thereof to an output of the power amplifier. The feedback filter receives the output of the power amplifier and provides a filtered feedback signal to the negative input of the comparator and towards the negative input of the input amplifier.

14 Claims, 5 Drawing Sheets

(51) Int. Cl.
*H03F 3/183* (2006.01)
*H03F 3/45* (2006.01)
*H03F 1/34* (2006.01)
*H03F 3/187* (2006.01)

(52) U.S. Cl.
CPC ..... *H03F 3/45475* (2013.01); *H03F 2200/03* (2013.01); *H03F 2200/171* (2013.01); *H03F 2200/66* (2013.01); *H03F 2200/78* (2013.01)

(58) Field of Classification Search
CPC ............ H03F 2200/03; H03F 2200/66; H03F 2200/78
USPC ........... 381/120, 123, 96, 98, 108, 107, 104; 348/E5.071; 326/30; 330/75, 293, 291, 330/251
See application file for complete search history.

(56) References Cited

U.S. PATENT DOCUMENTS

| | | | |
|---|---|---|---|
| 2006/0097784 A1* | 5/2006 | Lind | H03F 1/32 330/251 |
| 2009/0160551 A1* | 6/2009 | Chen | H03F 3/217 330/251 |
| 2011/0227645 A1* | 9/2011 | Mayuzumi | H03F 3/217 330/251 |

* cited by examiner

POWER AMPLIFIER

PRIORITY STATEMENT

This US non-provisional application claims priority under 35 USC § 119 to Swedish Patent Application No. 1550677-7, which was filed on May 26, 2015, the entire content of which is incorporated herein by reference.

BACKGROUND

1. Technical Field

The present invention generally relates to a power amplifier, and in particular to a self-oscillating class D power amplifier.

2. Description of Related Art

Switching power amplifiers also referred to as pulse modulation amplifiers, pulse width modulation (PWM) amplifiers or class D amplifiers are commonly used in applications where power dissipation is an important factor. Class D amplifiers have the benefit of lowering power consumption and decreasing the size/weight in view of e.g. class A amplifiers and hence the use of raw materials.

In such amplifiers there is an input stage for receiving an electrical input signal to be amplified, a modulating/switching or power stage and a filter. The switching stage generates a square wave signal, or a pulse train, which has a frequency that is much higher than the highest frequency in the operational frequency range of the electric signal to be amplified. The pulse width ratio of the square wave is modulated so that the average value of the square wave signal is proportional to the input signal. The filter is arranged to filter the square wave signal to a power output signal.

Another definition of class D amplifiers is that the power stage which delivers the energy to the load is operated in an "on/off" state where the average voltage value of this square wave is modulated to correspond to the set value. The only losses that appear are the low conduction losses during the "on" state and the switching losses from each time the output stage changes state.

The switching between on and off is made at a frequency which normally is around 400 kHz or more giving a high enough resolution in the audible band. Normally, a class D amplifier contains a second order low pass filter with a preferably high Q value for demodulating the PWM pulses. This filter shifts the phase asymptotically towards −180° and the higher the Q value the faster it reaches −180°. When the filter is loaded the Q value decreases.

The actual pulse width modulation can be performed in several different ways. The most obvious way is to use a reference signal, for example a triangle wave signal and then compare the input or set value to this reference signal. Each time those signals intersect the output stage changes state. A disadvantage with this reference signal technique is that the average value of the pulse train only corresponds to the set value as long as the supply voltages are constant and the state shift is infinitely fast plus of course, the triangle wave has to be ideal.

The reference signal technique does not have any feedback resulting in an absence of control over the demodulation filter. There are actually two signal paths, one from the input to the output and one from the supply rails to the output. The channel separation and power supply rejection become very poor. An advantage is that the switching frequency is constant. Supply feed forward can be used to lower the supply voltage dependence.

Using a digital device as a digital signal processor (DSP) for calculating the pulse width instead of comparing the set value to a tri wave signal basically gives the same result. However there are more possibilities to compensate for non-ideal features of components. A DSP solution also is more complicated and expensive.

A way of providing the pulse width modulation is by self-oscillation. A comparator is used to compare the average of the pulse train to the set value giving an error as a result. If the error is negative the positive switch is turned on and vice versa if it is positive. The frequency of operation is close to the frequency where the loop has minus 180° phase shift. Some solutions use the demodulation filter to do the averaging and this gives the amplifier the possibility to adjust errors that occur in and after the demodulation filter.

Without additional circuitry the switching frequency would be equal to the filter resonance frequency which usually is around 50 kHz and this normally is not acceptable. A zero and zero cancelling resistor is added in the sensing circuit to push the frequency up about a decade. The open loop gain of this topology can be approximated to the ratio between the supply rail voltage and the modulation signal amplitude, usually around 200 times. This open loop gain is not high enough to provide an amplifier with low non-linear distortion but since this loop gain works around the output filter it provides low linear distortion, i.e. gain and phase errors, compared to other topologies where a maximum of about 10 dB loop gain can be added around the output filter, at 20 kHz, without causing instability. The result of this post-filter self-oscillating topology is therefore that the linear distortion, i.e. distortion which does not add new frequency content like amplitude and phase, is low for being a class D amplifier but the non-linear distortion is still relatively high compared to a high quality amplifier. The small signal frequency response of this amplifier is close to a desirable first order since it is basically determined by the zero in the feedback path and hence the phase in the audible band shifts linearly as the frequency is increased. For example, U.S. Pat. No. 4,041,411 discloses a globally self-oscillating class D amplifier.

WO03/090343 discloses a power amplifier for amplifying an electric signal in an operational frequency range comprising switching means for generating a square wave signal by alternately switching the square wave signal to a first supply voltage or a second supply voltage, filter means for generating a power output signal by low pass filtering the square wave signal, input means for receiving the electric signal and driving the switching means, and a control circuit coupled to the output power signal and the input means for controlling the power amplifier.

A further option is to add a second order active integrator which demodulates the pulse train and gives significant loop gain at low frequencies. The switching frequency is then controlled by this integrator and not by the Q value of the output filter. The operation of this pre-filter self-oscillating topology is therefore robust and simple and it gives low-non linear distortion, especially at low frequencies.

However, in a pre-filter self-oscillating topology the linear distortion becomes high, i.e. the frequency response and phase is totally load dependant and a desired response curve can only be obtained with specific load impedance. The switching frequency of all self-oscillating topologies varies with the modulation depth, i.e. pulse width. This is an advantage for the efficiency as the switching losses becomes lower as the conduction losses increase, but if another loop is added to increase the loop gain there is a risk that this loop picks up the switching frequency and then the amplifier would go into a destructive sub-harmonic oscillation condition. It is therefore a desire to provide an alternative power amplifier.

SUMMARY

According to a first aspect, a power amplifier is provided comprising an input amplifier, a comparator, a switching circuit, an output filter and a feedback filter. The input amplifier is arranged to receive an input signal of the power amplifier at a positive input of the input amplifier and an output signal of the feedback filter at a negative input of the input amplifier, and the input amplifier is further arranged to have a capacitive feedback from an output of the input amplifier to the negative input of the input amplifier. The comparator is arranged to receive the output signal of the input amplifier at a positive input of the comparator and the output signal of the feedback filter at a negative input of the comparator wherein the comparator provides a control signal on an output of the comparator based on a comparison between signal levels of the signals at the inputs of the comparator. The switching circuit comprises power switches and is arranged to receive the control signal and control the power switches that connect an output of the switching circuit to either a positive supply voltage or a negative supply voltage based on the control signal. The output filter is arranged to receive an output signal provided at the output of the switching circuit and provide a filtered signal thereof to an output of the power amplifier. The feedback filter is arranged to receive the output of the power amplifier and provide a filtered feedback signal to the negative input of the comparator and towards the negative input of the input amplifier.

The power amplifier may comprise a clamp circuit arranged to limit the signal at the negative input of the input amplifier at high output signals from the input amplifier, wherein the clamp circuit is connected between the output of the input amplifier and the negative input of the input amplifier. The clamp circuit may comprise an inverting amplifier having its input connected to the output of the input amplifier and its output connected to the negative input of the input amplifier. The inverting amplifier may comprise a first amplifier stage having its input connected to the output of the input amplifier and its output connected to a second amplifier stage of the inverting amplifier via a voltage divider, and the second amplifier stage has its output connected to the negative input of the input amplifier, wherein the voltage divider is arranged to set a limit for the limiting of the signal at the negative input of the input amplifier. Alternatively, the clamp circuit may comprise a first zener diode and a second zener diode connected in series with opposite polarities between the output of the input amplifier and the negative input of the input amplifier such that the input amplifier is arranged to operate as a follower when voltage between the output of the input amplifier and the negative input of the input amplifier exceeds a sum of a zener voltage and a forward voltage of the respective zener diodes.

The capacitive feedback from the output of the input amplifier to the negative input of the input amplifier may comprise a capacitor element connected between the output of the input amplifier and the negative input of the input amplifier. The capacitor element may comprise a first capacitor and a second capacitor connected in series between the output of the input amplifier and the negative input of the input amplifier, and wherein a buffer circuit is arranged to provide a replica of the input signal of the power amplifier via a resistor to a junction between the first and the second capacitors. Alternatively, the capacitor element may comprise a first capacitor and a second capacitor connected in series between the output of the input amplifier and the negative input of the input amplifier, and wherein a resistor is connected between the positive input of the input amplifier and a junction between the first and the second capacitors.

The filtered feedback signal may be provided via a first feedback resistor and a second feedback resistor, connected in series, to the negative input of the input amplifier, and a capacitor coupling may be provided from a junction between the first feedback resistor and the second feedback resistor to the positive input of the input amplifier.

The power amplifier may be arranged to operate at audio frequencies and provide its output to a loudspeaker.

According to a second aspect, an audio amplifier arrangement is provided comprising a power amplifier according to the first aspect, and a power supply arranged to provide electric power to the power amplifier.

According to a third aspect, an audio amplifier arrangement is arranged to provide multiple amplified audio channels. The audio amplifier arrangement comprises a power amplifier according to the first aspect for each audio channel and a power supply arrangement arranged to provide electric power to the power amplifiers.

The power supply arrangement may comprise a power supply unit for each power amplifier.

The power supply arrangement may comprise a power supply unit arranged to provide electric power to a plurality of the power amplifiers.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DESCRIPTION OF NON-LIMITING EMBODIMENTS

The disclosure below relates to a power amplifier for amplifying an electric input signal in an operational frequency range, e.g. audio frequency range, and providing an output signal. The principle of the power amplifier comprises switching means for generating a square wave signal by alternately switching the square wave signal to a first supply voltage or a second supply voltage, and filter means for generating a power output signal by low pass filtering the square wave signal. The power amplifier further comprises input means for receiving the electric signal and driving the switching means, and a local feedback circuit connecting the output signal towards an input of the switching means, as will be further elucidated below.

Figure 1:
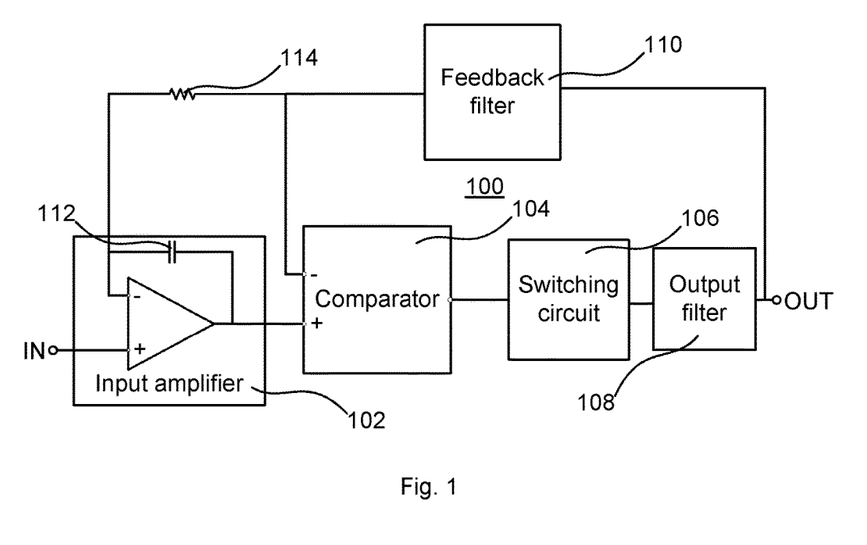
FIG. 1 schematically illustrates a power amplifier according to an embodiment.

FIG. 1 schematically illustrates a power amplifier 100 according to an embodiment. The power amplifier 100 comprises an input amplifier 102, a comparator 104, a switching circuit 106, an output filter 108 and a feedback filter 110. The respective elements 102-110 may be conventional for a class D amplifier except for the particular features set forth below, and for the sake of brevity, the conventional elements and their features are not described here not to obscure the inventive contribution.

The input amplifier 102 receives the input signal of the power amplifier 100 at a positive input of the input amplifier 102. On a negative input of the input amplifier 102 a feedback signal from the feedback filter 110 is received through resistor 114, which provides for avoiding that the input amplifier 110 loads the feedback to the class D amplifier, which in turn provides for self-oscillating properties of the class D amplifier. The input amplifier further has a capacitive feedback 112 connected between an output of the input amplifier 102 and the negative input of the input amplifier 102. Thus, the input amplifier 102 will work as an integrating regulator for the power amplifier 100 with the input signal as a reference signal and the feedback signal as a present value signal. The output of the input amplifier 102, which may be considered as a control signal to make the output of the power amplifier 100 correspond to the input signal, is provided to a positive input of the comparator 104. A negative input of the comparator 104 receives an output of the feedback filter 110. An output of the comparator is provided to the switching circuit 106 to control power switches thereof to connect either a positive supply voltage to an output of the switching circuit 106 or a negative supply voltage to the output of the switching circuit 106. The feedback to the comparator 104 will provide for self-oscillating properties of the class D amplifier. The output filter 108 receives the output signal from the switching circuit 106 and provides a filtered output which is the output signal of the power amplifier 100. The filtering filters such that an amplified version of the input signal of the power amplifier 100 is provided at the output while the self-oscillating frequency of the self-oscillating class D amplifier is attenuated. The output signal of the power amplifier 100 is also provided to the feedback filter 110 which provides loop filtering for the feedback loop back to the comparator 104 and input amplifier 102. A resistor 114 may be provided between the output of the feedback filter 110 and the negative input of the input amplifier 102.

Figure 10:
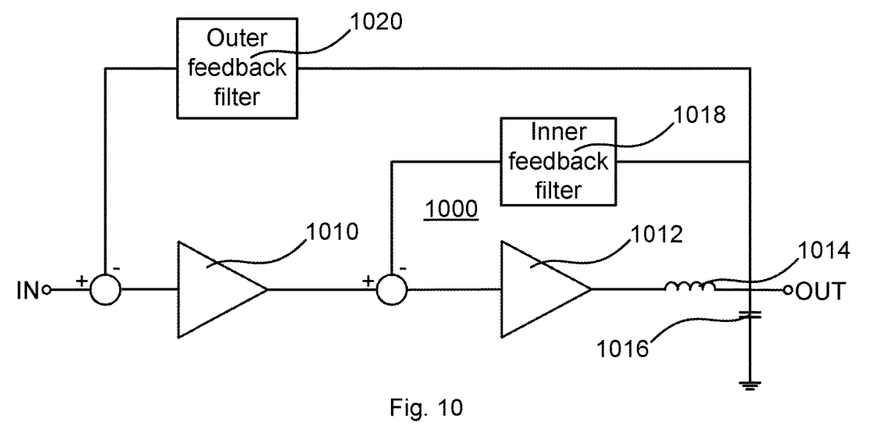
FIG. 10 illustrates a conventional approach for feedback for a class D amplifier.

FIG. 10 illustrates a conventional approach for a class D amplifier 1000 with an inner feedback loop and an outer feedback loop. The amplifier 1000 comprises an integrating amplifier 1010, a switching means 1012, a low pass filter comprising an inductor 1014 and a capacitor 1016, an inner feedback filter 1018, and an outer feedback filter 1020. The inner loop connects the output of the amplifier 1000 via the inner feedback filter 1018 to an inverting input of the switching means 1012. The outer loop connects the output of the amplifier 1000 via the outer feedback filter 1020 to an inverting input of the integrating amplifier 1010. The input of the amplifier 1000 is connected to a positive input of the integrating amplifier 1010. The output of the integrating amplifier 1010 is connected to a positive input of the switching means 1012. While the conventional amplifier as illustrated in FIG. 10 employs an approach where the outer feedback filter 1020 affects the transfer function of the amplifier 1000, the approach demonstrated with reference to embodiments above employs only a loop for the switching circuit 106 with feedback filter 110 and conditions on that loop is observed, i.e. measured, via the resistor 114 such that the loop for the switching circuit 106 is not affected by the measurement. The observed condition on the loop comprises the filtered output signal which comprises a first component being an amplified replica of the input signal and a second component being a residual of the self-oscillating switching. Since the second component is above a desired frequency band of the amplifier 100 and is filtered out by the integrating input amplifier 102, the integrating input amplifier will provide an output, i.e. the control signal discussed above, to the comparator such that the replica of the input signal becomes equal to the input signal. The above demonstrated approach provides for low distortion and the amplifier's frequency response is not prone to varying properties of the input amplifier 102, e.g. affected by variations in properties of a signal source connected to the input of the power amplifier 100, since the frequency properties of the input amplifier 102 does not affect the transfer function of the amplifier; the frequency properties of the input amplifier 102 may only affect the bandwidth of the control signal.

Figure 2:
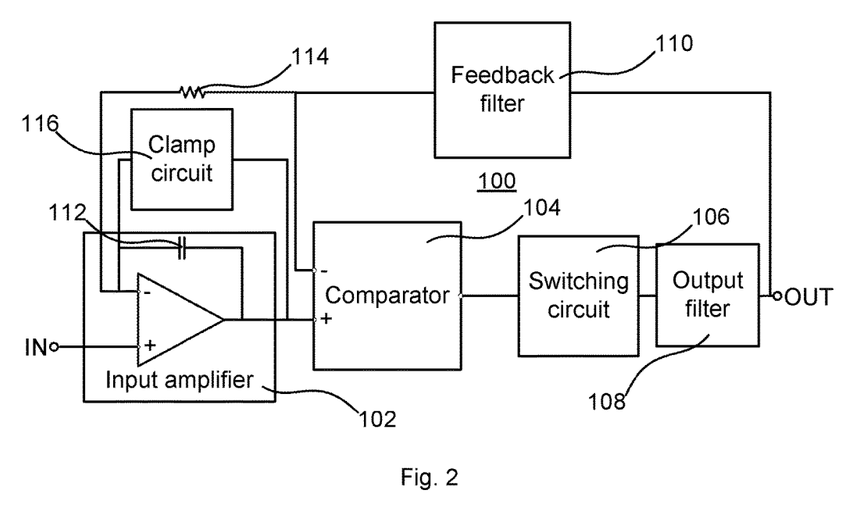
FIG. 2 schematically illustrates a power amplifier according to an embodiment.

FIG. 2 schematically illustrates a power amplifier 100 according to an embodiment. Here, the same reference numerals will be used as for the embodiment of FIG. 1 where no significant differences in corresponding elements are present and affect the gist of the invention. As the embodiment presented with reference to FIG. 1, the embodiment of the power amplifier 100 of FIG. 2 comprises an input amplifier 102, a comparator 104, a switching circuit 106, an output filter 108, a feedback filter 110, a capacitive feedback 112 and a resistor 114. The power amplifier 100 of FIG. 2 further comprises a clamp circuit 116 arranged to limit the signal at a negative input of the input amplifier 102 when the output from the input amplifier 102 is high, e.g. at start-up when there is a large difference between the input signal, i.e. the reference signal when considering the amplifier as a controller, and the output signal of the power amplifier 100. This limiting feature will improve stability under such conditions. The clamp circuit 116 may be implemented in various ways, which will be demonstrated with reference to FIGS. 3 to 5.

Figure 3:
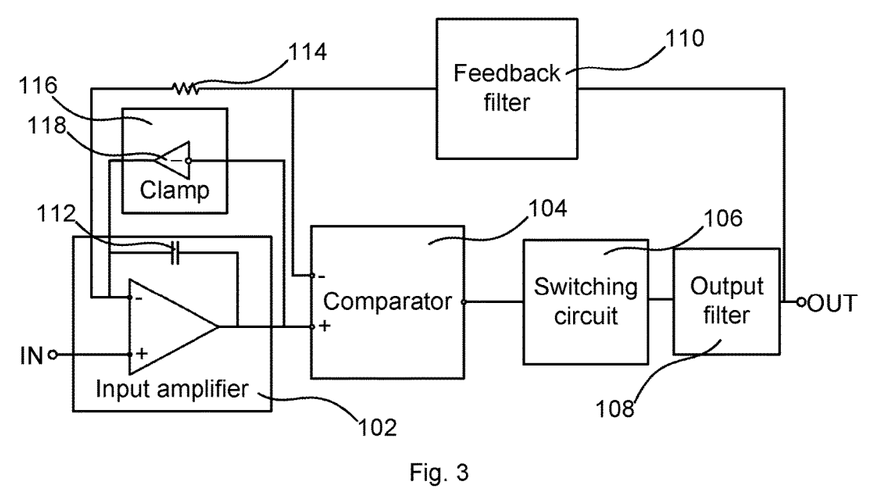
FIG. 3 schematically illustrates a power amplifier according to an embodiment.

FIG. 3 schematically illustrates a power amplifier 100 according to an embodiment. Here, the same reference numerals will be used as for the embodiment of FIG. 1 where no significant differences in corresponding elements are present and affect the gist of the invention. As the embodiment presented with reference to FIG. 2, the embodiment of the power amplifier 100 of FIG. 3 comprises an input amplifier 102, a comparator 104, a switching circuit 106, an output filter 108, a feedback filter 110, a capacitive feedback 112, a resistor 114 and a clamp circuit 116. Here, the clamp circuit 116 comprises an inverting amplifier 118 having its input connected to the output of the input amplifier 102 and its output connected to the negative input of the input amplifier 102. When the output of the input amplifier 102 becomes very high, i.e. the difference between the feedback signal and the input signal present at respective inputs of the input amplifier 102 is high, the inverting amplifier 118 will limit this by outputting a counteracting signal, i.e. a part of the difference will instead be present across the resistor 114 and not be amplified by the input amplifier 102. The properties of the inverting amplifier 118 may be set to achieve the desired stability. An example of an implementation of the inverting amplifier 118 will be demonstrated with reference to FIG. 4. Other implementations providing the similar properties are of course equally feasible.

Figure 4:
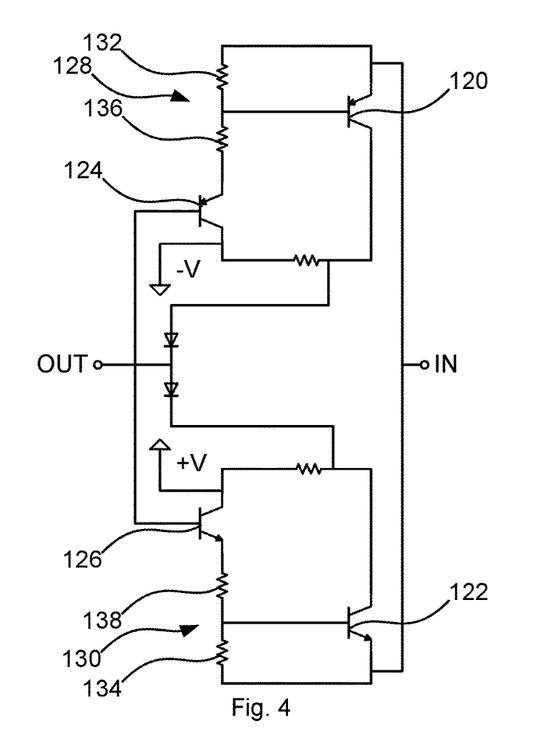
FIG. 4 schematically illustrates an inverting amplifier suitable for a clamp circuit according to an embodiment.

FIG. 4 schematically illustrates an inverting amplifier 118 suitable for the clamp circuit 116 demonstrated with reference to FIG. 3. Since the clamp circuit 116 is to be operating on both half-cycles of a signal, there is provided circuitry to take care of respective half-cycle each connected to a positive supply voltage and a negative supply voltage, respectively. An input of the inverting amplifier 118, which is to be connected to the output of the input amplifier 102 of FIG. 3, is connected to an input of a first amplifier stage comprising a transistor 120, 122 (for respective half-cycle). The first amplifier stage provides its output to a second amplifier stage comprising a transistor 124, 126 (for respective half-cycle) via a voltage divider 128, 130. The voltage divider 128, 130 may comprise a first resistor 132, 134 and a second resistor 136, 138 wherein the first resistor 132, 134 forms a feedback to the input signal of the inverting amplifier 118 and the second resistor 136, 138 is connected to the input of the second amplifier stage. By configuring the features of the voltage divider 128, 130, the limiting properties of the inverting amplifier 118 as desired can be achieved. The output of the second stage is provided as output of the inverting amplifier 118 and is thus connected to the negative input of the input amplifier 102 of FIG. 3.

Figure 5:
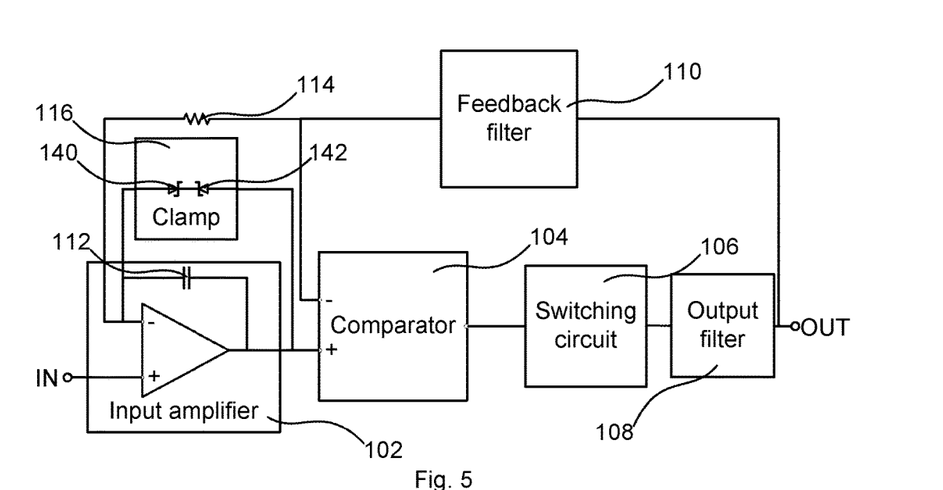
FIG. 5 schematically illustrates a power amplifier according to an embodiment.

FIG. 5 schematically illustrates a power amplifier 100 according to an embodiment. Here, the same reference numerals will be used as for the embodiment of FIG. 1 where no significant differences in corresponding elements are present and affect the gist of the invention. As the embodiment presented with reference to FIG. 2, the embodiment of the power amplifier 100 of FIG. 3 comprises an input amplifier 102, a comparator 104, a switching circuit 106, an output filter 108, a feedback filter 110, a capacitive feedback 112, a resistor 114 and a clamp circuit 116. Here, the clamp circuit 116 comprises a first zener diode 140 and a second zener diode 142 connected in series. The zener diodes 140, 142 are connected with opposite polarities such that a voltage across the series connection will not exceed the zener voltage plus a diode forward voltage for either polarity applied across the series connection. The series connection is connected between the output of the input amplifier 102 and the negative input of the input amplifier 102. When the above discussed limited voltage is reached between the output of the input amplifier 102 and the negative input of the input amplifier 102, the input amplifier will have properties of a follower, and stability is enhanced.

Figure 6:
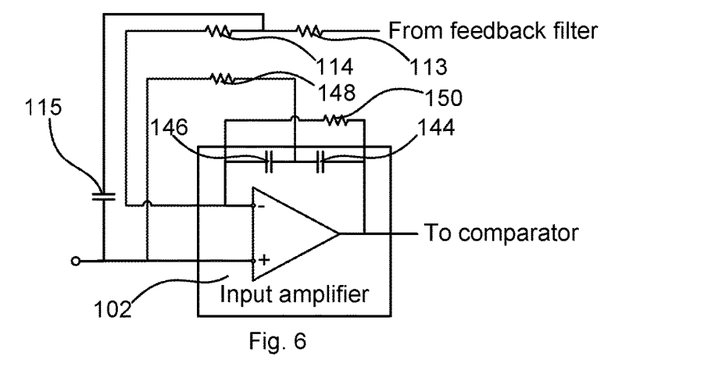
FIG. 6 illustrates a filtering approach for an input amplifier according to an embodiment.
Figure 7:
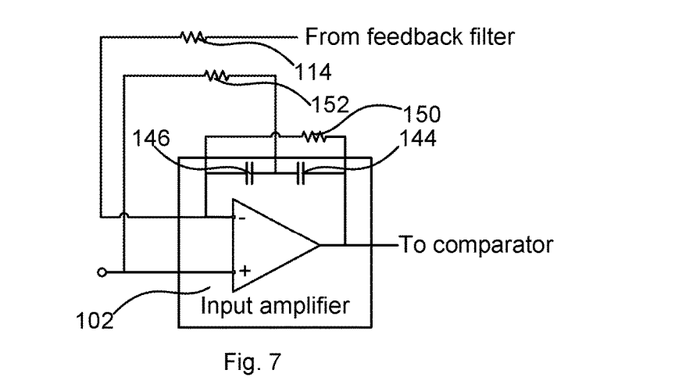
FIG. 7 illustrates a filtering approach for an input amplifier according to an embodiment.
Figure 8:
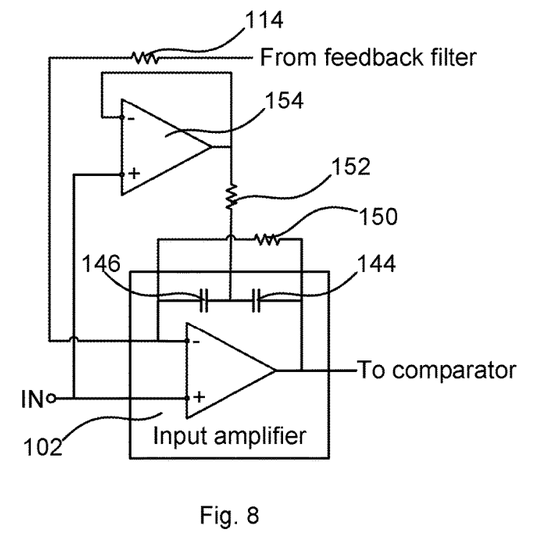
FIG. 8 illustrates a filtering approach for an input amplifier according to an embodiment.

The filtering properties of the input amplifier 102 are of low-pass character due to the capacitive feedback 112. By only applying a single capacitor element, e.g. an integrated capacitance or a discrete component capacitor, as schematically illustrated in FIGS. 1 to 3 and 5 provides a first order filtering. However, other filtering approaches are also feasible. FIGS. 6 to 8 illustrate examples of filtering approaches where a second order filtering component is provided. Here, the capacitor element comprises a first capacitor 144 connected in series with a second capacitor 146 for providing the capacitive feedback 112. In the embodiment illustrated in FIG. 6, a first resistor 148 is connected between an input signal of the input amplifier 102 and a junction between the first capacitor 144 and the second capacitor 146. A second resistor 150 is connected in parallel with the series connection of capacitors, i.e. between the output of the input amplifier 102 and the negative input of the input amplifier 102. Furthermore, the signal from the feedback filter 110, as illustrated in FIG. 5, is here provided to a first feedback resistor 113 in series with a second feedback resistor 114 towards the negative input of the input amplifier 102. From a junction between the first feedback resistor 113 and the second feedback resistor 114, where is a capacitor 115 connected towards the positive input of the input amplifier 102. This arrangement is arranged to provide for attenuation of frequencies outside the desired frequency band to be amplified by the power amplifier 100, i.e. at high frequencies emanating e.g. from residuals of switching operations. This enables improved gain within the desired frequency band to be amplified by the power amplifier 100 compared with gain outside the desired frequency band. It is to be noted that this arrangement is optional, and an embodiment without this option will be demonstrated with reference to FIG. 7.

In the embodiment illustrated in FIG. 7, a first resistor 152 is connected between an input signal of the input amplifier 102 and the junction between the first capacitor 144 and the second capacitor 146. A second resistor 150 is connected in parallel with the series connection of capacitors, i.e. between the output of the input amplifier 102 and the negative input of the input amplifier 102. In the embodiment illustrated in FIG. 8, which may be considered as a variant of the embodiment of FIG. 7, the first resistor 152 is connected between an output of a buffer circuit 154 and the junction between the first capacitor 144 and the second capacitor 146. The second resistor 150 is also here connected in parallel with the series connection of capacitors, i.e. between the output of the input amplifier 102 and the negative input of the input amplifier 102. The buffer circuit 154 comprises an amplifier configured as a follower with its positive input connected to the input of the input amplifier 102, i.e. the input of the power amplifier 100, and its negative input connected to the output of the amplifier. Compared with the embodiment demonstrated with reference to FIG. 7, the embodiment of FIG. 8 will cause less load on a signal source connected to the input of the power amplifier, which is particularly advantageous when the output impedance of the signal source is not very low. The arrangement demonstrated with reference to FIG. 5 for improved gain within the desired frequency band to be amplified by the power amplifier 100 compared with gain outside the desired frequency band may also be used for the embodiment demonstrated with reference to FIG. 8.

Any of the embodiments demonstrated with reference to FIGS. 6 to 8 may be applied to any of the embodiments demonstrated with reference to FIGS. 1 to 5 wherein the capacitive feedback 112 as illustrated in any of FIGS. 1 to 3 and 5 is substituted by the elements as demonstrated with any of FIGS. 6 to 8.

In the embodiments illustrated with reference to FIGS. 6 to 8, the application of the first and second capacitors and the application of the first and second resistors provides for improved filtering characteristics of the integrating input amplifier with a flat gain in the desired band, a slight increase of gain close to a cut-off frequency and a significant decrease of gain above the cut-off frequency.

Figure 9:
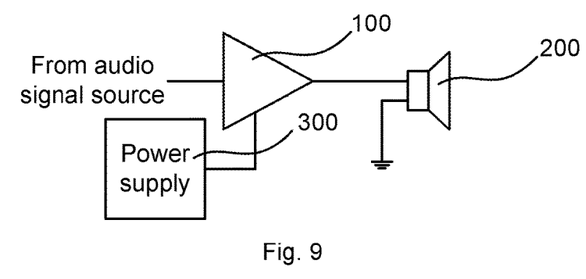
FIG. 9 schematically illustrates a power amplifier operating as an audio power amplifier.

FIG. 9 schematically illustrates a power amplifier 100 according to any of the above demonstrated embodiments and their variants operating as an audio power amplifier and loaded by a loudspeaker 200. The input of the power amplifier is provided with an audio signal, e.g. having signals within the frequency range 20 Hz to 20 kHz, which is amplified as demonstrated above and provided to the loudspeaker 200. The power amplifier 100 is powered by a power supply 300. The power amplifier 100 and the power supply 300 may be implemented as a module.

An arrangement for providing a plurality of amplified audio channels may be provided, wherein each channel comprises a power amplifier 100. A common power supply 300 may be provided for more than one power amplifier 100, or each power amplifier 100 may be powered by a separate power supply 300.

Figure 11:
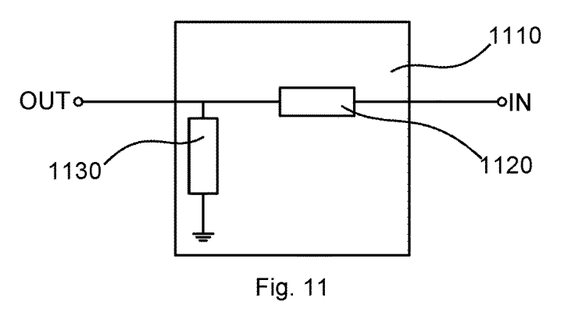
FIG. 11 schematically illustrates a feedback filter according to an embodiment.

FIG. 11 illustrates a feedback filter 1110 according to an embodiment. The feedback filter 1110 is suitable for implementing the feedback filter 110 demonstrated with reference to FIG. 5. The feedback filter 1110 comprises a first impedance 1120 connected between an input of the feedback filter 1110 and an output of the feedback filter 1110, and a second impedance 1130 connected between the output of the feedback filter 1110 and ground or similar signal reference point. Considering the discussion above regarding the feedback loop and the observing of conditions on the feedback, the skilled reader here realizes that, when implementing the feedback filter 110 by the feedback filter 1110, the input to the negative input of the input amplifier 102 in some sense corresponds to the signal appearing across the second impedance 1130, and the resistor 114 provides for appropriate measuring without affecting the feedback loop. With reference to FIGS. 12 to 16, different suggestions on feasible impedances and impedance structures for the impedances 1120, 1130 of the feedback filter 1110 are demonstrated.

Figure 12:
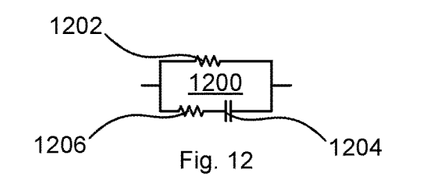
FIGS. 12 to 16 illustrate impedance structures according to embodiments with relation to the feedback filter.

FIG. 12 illustrates an impedance structure 1200 suitable for implementing the first impedance 1120 according to an embodiment. The impedance structure 1200 comprises a first resistor 1202 connected in parallel with a series connection of a capacitor 1204 and a second resistor 1206.

Figure 13:
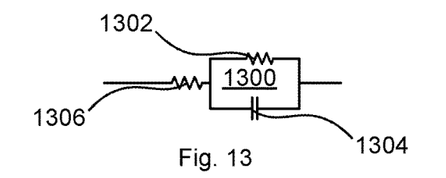

FIG. 13 illustrates an impedance structure 1300 suitable for implementing the first impedance 1120 according to an embodiment. The impedance structure 1300 comprises a first resistor 1302 connected in parallel with a capacitor 1304 and the parallel coupling is connected in series with a second resistor 1306.

Figure 14:
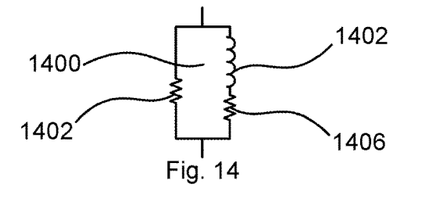

The second impedance 1130 may in its most basic embodiment comprise only a resistor. FIG. 14 illustrates an impedance structure 1400 suitable for implementing the second impedance 1130 according to an embodiment. The impedance structure 1400 comprises a first resistor 1402 connected in parallel with a series connection of an inductance 1404 and a second resistor 1406.

Figure 15:
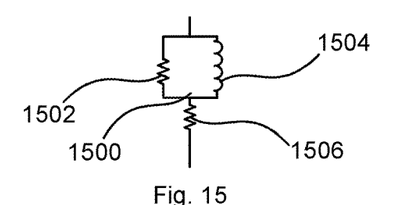

FIG. 15 illustrates an impedance structure 1500 suitable for implementing the second impedance 1130 according to an embodiment. The impedance structure 1500 comprises a first resistor 1502 connected in parallel with an inductance 1504 and the parallel coupling is connected in series with a second resistor 1506.

Figure 16:
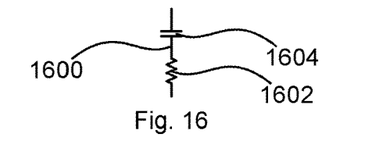

FIG. 16 illustrates an impedance structure 1600 suitable for implementing the second impedance 1130 according to an embodiment. The impedance structure 1600 comprises a first resistor 1602 connected in series with a capacitor 1604.

The second impedance 1130 may in its most basic embodiment comprise only a resistor 1700, as illustrated in FIG. 17.

Any of the embodiment for the first impedance 1120 may be combined with any of the embodiments for the second impedance 1130 for achieving a feedback filter 110 with desired properties.

With the above demonstrated embodiments and their variants in mind, a general discussion will here be provided, which may apply to one or more of the above demonstrated embodiments, or only provides information for the better understanding of the presented embodiments.

The need to increase the loop gain in order to lower the non-linear distortion of self-oscillating class D amplifiers is desired to be achieved without affecting the gain and phase response of the system. This is done by using an error amplifier which has as much gain as possible in e.g. the audio band, i.e. 20 Hz to 20 kHz, but as much attenuation as possible of the switching residual. The correction signal appearing on the output of this error amplifier ideally only contains compensation signals for the audio band content and no remains of the switching frequency. The phase shift of the error amplifier is large at high frequencies and hence the amplitude of the switching frequency residual in the compensation signal is added out of phase on the positive input thereby lowering the effect of the added loop gain due to a lower ratio between supply rails and the modulation signal.

By providing a non-inverting globally self-oscillating class D amplifier, lower non-linear distortion is provided without affecting the frequency response of the same. This non-inverting globally modulated class D amplifier comprises a comparator which has a positive input and a negative input. The output of this comparator controls two power switches that connect a demodulation filter to either the positive supply voltage or the negative supply voltage. This demodulation filter provides a power output which is connected to a load, e.g. a loudspeaker. The positive input of the comparator receives an input signal and the negative input receives a feedback signal from the power output. The signal appearing on the negative input, minus the signal on the positive input, is proportional to the error on the output of the amplifier.

The input signal to the positive input of the comparator is provided by an integrating, inverting error amplifier which has its positive input connected to the audio input signal hence the audio input signal is the reference for this error amplifier. The error amplifier measures the error on the negative input of the comparator, compares it to the audio input signal on its positive input, amplifies the difference as much as possible in the audio band and attenuates it as much as possible outside of the audio band. What this error amplifier will do is work to make sure that the same signal as it receives on its positive input will appear on the negative input of the comparator. If it succeeds with this entirely, the class D amplifier will have no non-linear distortion in the audio band.

This type of amplifier will have a low linear distortion compared to other class D amplifiers. A further advantage is that the frequency and gain response of the class D stage is not affected by the error amplifier.

The frequency response shows large bandwidth and the output impedance is low. By adding an integrating error amplifier the non-linear distortion is substantially reduced.

In order to make the amplifier behave well during clipping and during start-up the integrating error amplifier may be provided with a clamp, so as to limit the error correction signal. The clamp may be connected across an integrating capacitor included in the integrator. In various embodiments the clamp comprises two zener diodes that will turn the integrator into a follower if the voltage across the integrating capacitor exceeds the zener voltage plus 0.7 V in either direction. Other ways are available to realize this clamp, as demonstrated above. For example, an inverting amplifier may be provided with its input connected to the output of the error amplifier and its output connected to the negative input of the error amplifier. When the error signal becomes too high, the inverting amplifier will limit the error signal to the negative input of the error amplifier.

An embodiment of the power amplifier compared with a conventional globally modulated class D stage with traditional negative feedback around it is likely to provide the following result: The amplifier with the traditional negative feedback provides −3 dB at 73 kHz and the absolute phase shift at 20 kHz is −27 degrees. The embodiment of the power amplifier with the integrating error amplifier shows a −3 dB point at 120 kHz and −18 degrees phase shift at 20 kHz. Thus, the frequency and phase response is almost unchanged as compared with the globally self-oscillating class D stage by itself.

The invention has mainly been described above with reference to a few embodiments. However, as is readily appreciated by a person skilled in the art, other embodiments than the ones disclosed above are equally possible within the scope of the invention, as defined by the appended patent claims.

What is claimed is:

1. A power amplifier comprising:
an input amplifier;
a comparator;
a switching circuit;
an output filter; and
a feedback filter;
wherein the input amplifier is arranged to receive an input signal of the power amplifier at a positive input of the input amplifier and an output signal of the feedback filter at a negative input of the input amplifier, and the input amplifier is further arranged to have a capacitive feedback from an output of the input amplifier to the negative input of the input amplifier;
wherein the comparator is arranged to receive the output signal of the input amplifier at a positive input of the comparator and the output signal of the feedback filter at a negative input of the comparator, wherein the comparator provides a control signal on an output of the comparator based on a comparison between signal levels of the signals at the positive and the negative inputs of the comparator;
wherein the switching circuit includes power switches and is arranged to receive the control signal and control the power switches that connect an output of the switching circuit to either a positive supply voltage or a negative supply voltage based on the control signal;
wherein the output filter is arranged to receive an output signal provided at the output of the switching circuit and provide a filtered signal thereof to an output of the power amplifier; and
wherein the feedback filter is arranged to receive the output of the power amplifier and provide the output signal of the feedback filter to the negative input of the comparator and towards the negative input of the input amplifier.

2. The power amplifier of claim 1, comprising:
a clamp circuit arranged to limit the signal at the negative input of the input amplifier at high output signals from the input amplifier;
wherein the clamp circuit is connected between the output of the input amplifier and the negative input of the input amplifier.

3. The power amplifier of claim 2, wherein the clamp circuit comprises an inverting amplifier having an input connected to the output of the input amplifier and an output connected to the negative input of the input amplifier.

4. The power amplifier of claim 3, wherein the inverting amplifier comprises a first amplifier stage having an input connected to the output of the input amplifier and an output connected to a second amplifier stage of the inverting amplifier via a voltage divider;
wherein the second amplifier stage has an output connected to the negative input of the input amplifier; and
wherein the voltage divider is arranged to set a limit for the limiting of the signal at the negative input of the input amplifier.

5. The power amplifier of claim 2, wherein the clamp circuit comprises a first zener diode and a second zener diode connected in series with opposite polarities between the output of the input amplifier and the negative input of the input amplifier such that the input amplifier is arranged to operate as a follower when voltage between the output of the input amplifier and the negative input of the input amplifier exceeds a sum of a zener voltage and a forward voltage of the respective zener diodes.

6. The power amplifier of claim 1, wherein the capacitive feedback from the output of the input amplifier to the negative input of the input amplifier comprises a capacitor element connected between the output of the input amplifier and the negative input of the input amplifier.

7. The power amplifier of claim 6, wherein the capacitor element comprises a first capacitor and a second capacitor connected in series between the output of the input amplifier and the negative input of the input amplifier; and
wherein a buffer circuit is arranged to provide a replica of the input signal of the power amplifier via a resistor to a junction between the first and the second capacitors.

8. The power amplifier of claim 6, wherein the capacitor element comprises a first capacitor and a second capacitor connected in series between the output of the input amplifier and the negative input of the input amplifier; and
wherein a resistor is connected between the positive input of the input amplifier and a junction between the first and the second capacitors.

9. The power amplifier of claim 1, wherein the filtered output signal of the feedback filter is provided via a first feedback resistor and a second feedback resistor, connected in series, to the negative input of the input amplifier; and wherein a capacitor coupling is provided from a junction between the first feedback resistor and the second feedback resistor to the positive input of the input amplifier.

10. The power amplifier of claim 1, arranged to operate at audio frequencies and provide its output to a loudspeaker.

11. An audio amplifier arrangement comprising:
a power amplifier of claim 1; and
a power supply arranged to provide electric power to the power amplifier.

12. An audio amplifier arrangement arranged to provide multiple amplified audio channels, the audio amplifier arrangement comprising
a power amplifier of claim 1 for each audio channel; and
a power supply arrangement arranged to provide electric power to the power amplifiers.

13. The audio amplifier arrangement of claim 12, wherein the power supply arrangement comprises a power supply unit for each power amplifier.

14. The audio amplifier arrangement of claim 12, wherein the power supply arrangement comprises a power supply unit arranged to provide electric power to a plurality of the power amplifiers.

* * * * *